US010641808B2

(12) United States Patent
Rowell et al.

(10) Patent No.: US 10,641,808 B2
(45) Date of Patent: May 5, 2020

(54) TEST CHAMBER AND TEST SYSTEM

(71) Applicant: Rohde & Schwarz GmbH & Co. KG, Müchen (DE)

(72) Inventors: Corbett Rowell, Müchen (DE); Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 113 days.

(21) Appl. No.: 15/988,856

(22) Filed: May 24, 2018

(65) Prior Publication Data

US 2019/0361064 A1    Nov. 28, 2019

(51) Int. Cl.
*G01R 29/10* (2006.01)
*H04B 17/15* (2015.01)
*H05K 7/20* (2006.01)
*G01R 29/08* (2006.01)
*H04B 17/12* (2015.01)

(52) U.S. Cl.
CPC ....... *G01R 29/105* (2013.01); *G01R 29/0878* (2013.01); *H04B 17/12* (2015.01); *H04B 17/15* (2015.01); *H05K 7/20163* (2013.01)

(58) Field of Classification Search
CPC ........ H01Q 29/08; H04B 17/15; H04B 17/12; G01R 29/105; G01R 29/0878
USPC .......................................................... 343/703
See application file for complete search history.

(56) References Cited

U.S. PATENT DOCUMENTS

| 2011/0084887 | A1* | 4/2011 | Mow ...................... | G01R 29/10 343/703 |
| 2011/0095932 | A1* | 4/2011 | Winebrand .......... | H05K 9/0001 342/4 |
| 2011/0200084 | A1* | 8/2011 | Griesing ................ | H01Q 3/267 375/224 |
| 2014/0141727 | A1* | 5/2014 | Kildal ................ | G01R 29/0821 455/67.12 |
| 2014/0327586 | A1* | 11/2014 | Huff ................... | G01R 29/0821 343/703 |
| 2015/0017928 | A1* | 1/2015 | Griesing ............ | H04B 17/0085 455/67.14 |
| 2017/0279546 | A1* | 9/2017 | McGarry .......... | H04B 17/0085 |
| 2018/0109335 | A1 | 4/2018 | Rowell et al. | |

FOREIGN PATENT DOCUMENTS

EP    3 312 619 A1    4/2018

* cited by examiner

*Primary Examiner* — Huedung X Mancuso
(74) *Attorney, Agent, or Firm* — Westman, Champlin & Koehler, P.A.

(57) ABSTRACT

This application relates to a test chamber for testing a device under test (DUT), the test chamber comprising: a plurality of chamber walls defining an interior of the test chamber which are configured to provide an anechoic and shielded test chamber, an antenna arrangement which is arranged in the form of a plane-wave synthesizing array and which is configured to emit plane-waves into the interior of the test chamber, a receiving area for receiving the DUT, wherein in a test mode the receiving area forms a region of measurement of the DUT, wherein the receiving area is formed by a portion of a first wall of the test chamber and wherein the receiving area is configured such that during test mode heat from the DUT is transferred to the outside of the test chamber. The application further relates to a test system comprising such a test chamber.

18 Claims, 3 Drawing Sheets

TEST CHAMBER AND TEST SYSTEM

FIELD OF THE INVENTION

The present application relates to a test chamber for testing a device under test. The application further relates to a test system comprising such a test chamber.

TECHNICAL BACKGROUND

The present invention and its underlying problems are described hereinafter with regard to a device under test (DUT) which is designed as a base station, however, without limiting the invention to it.

In radio communications, a base station (or base radio station) is a wireless communications station installed at a fixed location and used to communicate as part of a wireless telephone system, such as a cellular CDMA or as a cell of a GSM, UMTS, LTE or 5G network. A wireless base station is configured to communicate with a mobile device, such as a mobile phone, smart phone, tablet, router, etc. For example, in a wireless telephone system, the signals from one or more mobile devices in an area are received preferably at a nearby base station, which then is able to connect the call to a land-line network or directly to another nearby mobile device.

A base station of a wireless communications system needs to be tested prior to their use. In particular, in the very last step of a production line, it is essential to test if mounting the antenna on a base station adversely affects the performance of this base station. In the state of the art, test systems are known which are used for testing a device under test, for instance a 4G or 5G communication device. The test system usually comprises an anechoic test chamber and an antenna arrangement which is arranged inside the test chamber. Such a test system is described, for example, in EP 3 312 619 A1.

While testing small portable mobile devices is comparatively manageable, testing a base station and its antenna arrays requires much more effort simply because of their overall size. In particular, a test chamber must be provided here, which is dimensioned to accommodate a base station. The so-called OTA (over the air) testing of the antenna elements of the base station plays a special role here. In addition, base stations are high-power devices which, especially due to their high transmission power, during testing produce a considerable amount of heat which may influence the test results negatively. Therefore, known test systems use correspondingly large test chambers, which, however, are not suitable for testing a base station in production lines and which are also cost-intensive. Smaller sized test chambers can be equipped with an appropriate cooling equipment to largely reduce the effects caused by heat generation. However, the cooling is quite complex and therefore cost-intensive.

This is a situation that needs to be improved.

SUMMARY OF THE INVENTION

Against this background, there is the need to provide high power testing and over the air measurement of wireless electronic devices, such as base stations, with compact test chambers within a production line.

According to a first aspect, a test chamber for testing a wireless device under test (DUT) is provided. The test chamber comprises: a plurality of chamber walls defining an interior of the test chamber which are arranged and configured such to provide a closed, anechoic and shielded test chamber; an antenna arrangement which is arranged in the form of a plane-wave synthesizing array and which is configured to emit plane-waves into the interior of the test chamber; a DUT receiving area for receiving the DUT, wherein in a test mode the DUT receiving area forms a region of measurement of the DUT, wherein the DUT receiving area is formed by a portion of a first wall of the test chamber and wherein the DUT receiving area is configured such that during test mode heat from the DUT is transferred to the outside of the test chamber.

According to a second aspect, a test system for testing a device under test (DUT) is provided. The test system comprises: a test chamber comprising: a plurality of chamber walls defining an interior of the test chamber which are configured to provide an anechoic and shielded test chamber, an antenna arrangement which is arranged in the form of a plane-wave synthesizing array and which is configured to emit plane-waves into the interior of the test chamber, a DUT receiving area for receiving the DUT, wherein in a test mode the DUT receiving area forms a region of measurement of the DUT, wherein the DUT receiving area is formed by a portion of a first wall of the test chamber and wherein the DUT receiving area is configured such that during test mode heat from the DUT is transferred to the outside of the test chamber, an input/output terminal for connecting the test chamber to a test equipment; and a test equipment connected to the input/output terminal and configured to transmit via the antenna arrangement a test data stream to a DUT and which is further configured to receive and to analyse corresponding response data streams.

The present invention is based on the idea, that a DUT receiving area is formed by a portion of a wall of the test chamber. During a test mode the DUT receiving area and thus a DUT which is placed on the DUT receiving area is thermally connected to the outside of the test chamber. This way, it is possible to transfer heat from the DUT or the DUT receiving area effectively and with minimal effort through the housing walls to the outside of the test chamber.

Advantageous configurations and developments emerge from the further dependent claims and from the description with reference to the figures of the drawings.

According to an aspect of this application, the receiving area comprises a first heat sink. The first heat sink comprises a contact surface for a mechanical contact with the DUT during the test mode. The first heat sink is embedded in the first wall of the receiving area and is protruding to the outside of the test chamber such that during the test mode heat is transferred from the DUT via the first heat sink to the outside of the test chamber. In this case, the DUT may be arranged fully inside the test chamber.

According to a further aspect, the first heat sink is a heat tube which for example is arranged fully outside the test chamber in order to effectively vent heat away from the DUT.

According to another aspect of this application, the DUT receiving area comprises an opening for receiving the DUT. The DUT receiving area and its opening are arranged and configured such that during a test mode the DUT is fully embedded or integrated in the opening and a rear portion of the DUT is protruding to the outside of the test chamber. In this case, the rear side of the DUT may form a heat sink. The antenna portion of the DUT may be located inside and faced to the interior of the test chamber.

According to an aspect of this application, portions of the first wall which are surrounding the DUT receiving area are tilted to form a slope or a ramp around the DUT receiving area such to reduce scattering caused by the rear portion of the test chamber.

According to an aspect of this application, the antenna arrangement is a measurement antenna array (MEAS) which comprises a plurality of typically identical antenna elements.

According to another aspect, the antenna arrangement is a plane wave converter (PWC).

According to a further aspect of this application, the antenna arrangement is arranged and placed fully in the interior of the test chamber.

According to another aspect, the antenna arrangement is arranged partially in the interior of the test chamber such that other portions of the antenna arrangement are protruding through a second wall of the test chamber to the outside of the test chamber.

According to another aspect of this application, portions of the second wall which are surrounding the antenna arrangement are tilted to form a further slope or ramp around the antenna arrangement.

According to further aspect, the antenna arrangement comprises a second heat sink which is embedded in a second wall of the test chamber and which is protruding to the outside of the test chamber such that during test mode heat is transferred from the antenna arrangement via the second heat sink to the outside of the test chamber.

One further aspect of the applications describes that the second heat sink is a heat tube which is in particular arranged outside the test chamber in order to vent heat away from the antenna arrangement.

Another aspect of the application describes that the test equipment comprises a signal generation device for generating test data streams. The test equipment further comprises an analysis device for analysing the received response data streams.

According to another aspect of this application, the DUT receiving area of the test chamber is configured to receive a base station and wherein the test system is configured to conduct over the air (OTA) testing of the base station.

Where appropriate, the above-mentioned configurations and developments can be combined in any manner. Further possible configurations, developments and implementations of the invention also include combinations, which are not explicitly mentioned, of features of the invention which have been described previously or are described in the following. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which.

Figure 1:
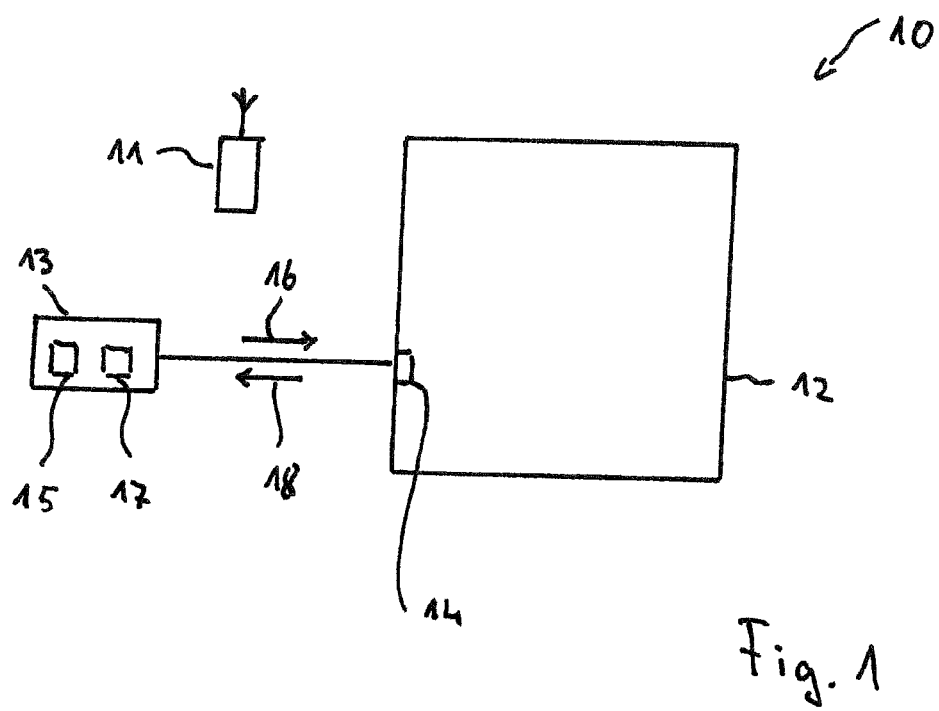
FIG. 1 shows a block diagram of a test system for testing a device under test.

The appended drawings are intended to provide further understanding of the invention. They illustrate examples and, in conjunction with the description, help to explain principles and concepts of the invention. Other examples and many of the advantages mentioned become apparent in view of the drawings.

The elements in the drawings are not necessarily shown to scale.

In the drawings, like, functionally equivalent and identically operating elements, features and components are provided with like reference signs in each case, unless stated otherwise.

DESCRIPTION OF EXAMPLES

FIG. 1 shows a block diagram of a test system for testing a device under test according to the invention.

In FIG. 1, the test system is denoted by reference numeral 10. The test system 10 is configured to test a device under test (DUT) 11. For this purpose, the test system 10 includes an anechoic test chamber 12 and a test equipment 13. The test chamber 12 comprises at least one input/output (I/O) terminal 14. The test equipment 13 is connected via suitable electric cables and connectors to the I/O terminal 14 of the test chamber 12.

The test equipment 13 comprises a signal generation device 15 for generating a test data stream 16 which is provided to the test chamber 12. The test equipment 13 further comprises an analysis device 17 for analysing corresponding response data streams 18 which the test equipment 13 receives in response to the transmitted data stream 16.

Figure 2:
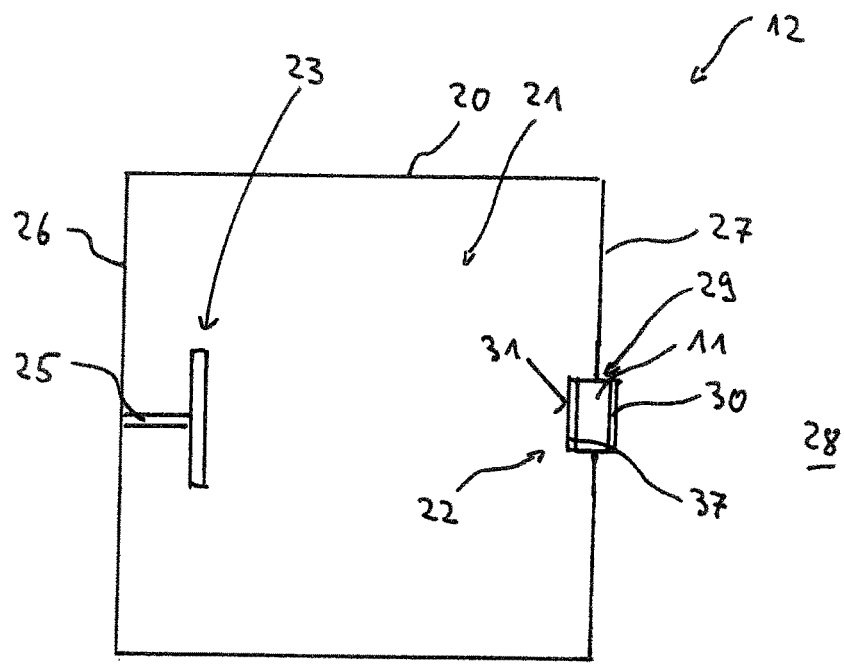
FIG. 2 shows a first example of the test chamber of the test system of FIG. 1.

FIG. 2 shows a first, highly simplified example of the test chamber of the test system of FIG. 1.

In the example of FIG. 2 the test chamber 12 is a closed cabinet-shaped apparatus. However, the present invention should not be restricted to this kind of test chamber shapes. Moreover, the test chamber 12 may also be a room, a chamber, a cupboard, a box, a package, or the like. The test chamber 12 is shielded in a suitable manner, in particular against electric and electronic interferences, such as RF signals and noise.

The test chamber 12 is configured and dimensioned such to receive and wirelessly test base stations of telecommunication systems. More particular, the test chamber 12 is an RF test chamber 12 which is configured to provide OTA testing of the antennas of those base stations. For this purpose, the test chamber 12 is configured to cope with all requirements of automatic production lines. These requirements include automatic opening and closing of the RF chamber 12 and a long service life. The test chamber 12 provides a high shielding effectiveness over a wide frequency range which enables it to perform tests on DUTs which have a radio interface in accordance with numerous standards. These include GSM, ISM, LTE, 5G, cdma2000, WCDMA, WiMAX, Bluetooth, WLAN and ZigBee. An automatic and/or manual handling of the test chamber 12 may also be available.

The test chamber 12 comprises a housing 20 with a housing interior 21. Suitable shielding elements (not shown in FIG. 2) are attached to the interior walls of the housing 20 to ensure an optimal test environment.

The test chamber 12 further comprises a DUT receiving area 22 for receiving the DUT and an antenna arrangement 23.

In FIG. 2 the antenna arrangement 23 is arranged in the interior 21 of the test chamber 12 and is connected via a bracket 25 to the left wall 26 of the housing 20.

The antenna arrangement 23 is preferably a measurement antenna (MEAS) array. This MEAS array has a plurality of individual and preferably identical antenna elements that form a plane wave synthesizing array in order to emit electromagnetic plane waves for testing purposes. The individual antenna elements are controlled such that the whole antenna array is deemed to be one single antenna element emitting one electromagnetic signal having certain characteristics. Accordingly, phases and amplitudes of the electromagnetic waves emitted by the individual antenna elements are adjusted appropriately.

Alternatively or additionally, the antenna arrangement 23 may also comprise a plane wave converter (PWC).

The DUT receiving area 22 is formed by a portion of the right wall 27 of the housing 20. In a test mode, the DUT receiving area 22 forms a region of measurement of the DUT 11.

In FIG. 2 the DUT receiving area 22 comprises an opening 29. During test mode, the DUT 11 is embedded within the opening 29 such that the DUT 11 is only partially arranged inside the test chamber 12. In particular, a rear portion 30 of the DUT 11, which may form a heat sink, is protruding through the housing wall 27 to the outside 28 of the test chamber 12. The front side 31 of the DUT 11, which for example comprises or includes an antenna under test (AUT) 37 of the DUT 11, is arranged in the interior 21 of the test chamber 12. The DUT receiving area 22 is configured such that during test mode heat from the DUT 11 is transferred from the DUT 11 to the outside 28 of the test chamber 12.

Figure 3:
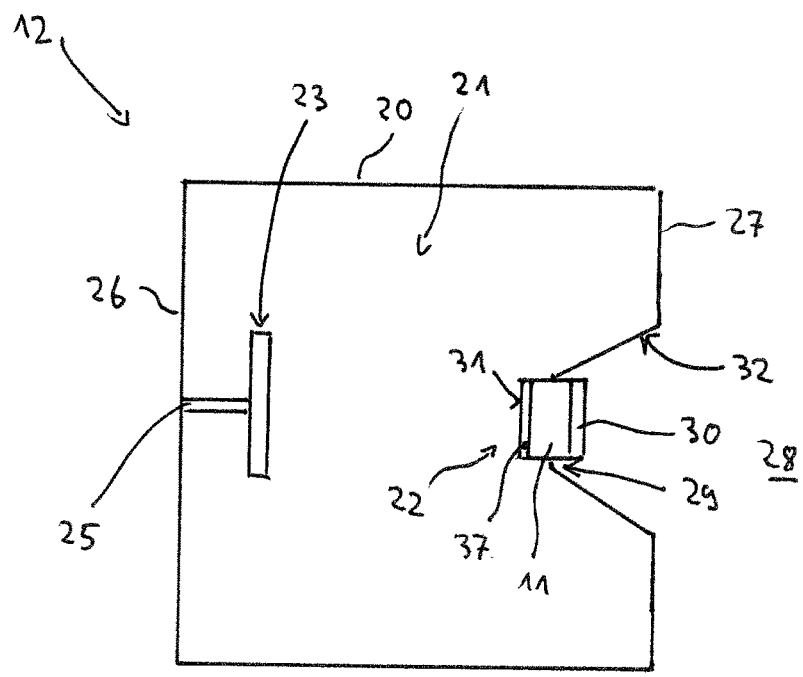
FIG. 3 shows a second example of the test chamber of the test system of FIG. 1.

FIG. 3 shows a second example of the test chamber of the test system of FIG. 1.

In contrast to the example shown in FIG. 2, the portions of the housing wall 27 which are surrounding the DUT receiving area 22 are tilted to form a slope or a ramp 32 around the DUT receiving area 22. With this slope or ramp 32 it is possible to remove or at least to reduce scattering and or reflections. As such, the test conditions are improved significantly with this measure.

Figure 4:
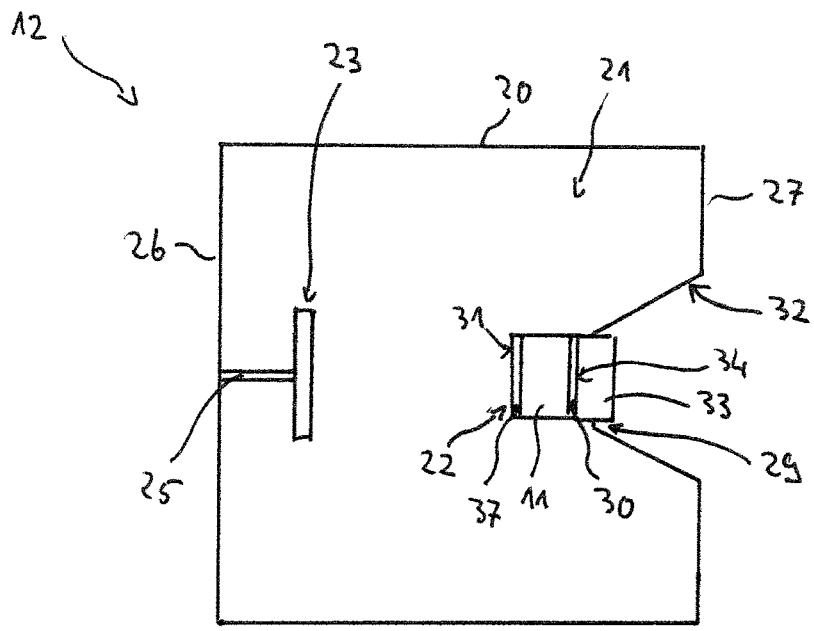
FIG. 4 shows a third example of the test chamber of the test system of FIG. 1.

FIG. 4 shows a third example of the test chamber of the test system of FIG. 1.

In contrast to the example shown in FIG. 3, the DUT receiving area 22 additionally comprises a heat sink 33. This heat sink 33 is embedded in the housing wall 27. The heat sink 33 is faced to the interior 21 of the test chamber 12 and comprises a receiving surface 34 for providing a mechanical contact with the DUT 11 when the DUT 11 is placed on the receiving surface 34 during test mode. The heat sink 33 is further embedded in the housing wall 27 in a suitable manner such that it is protruding to the outside 28 of the test chamber 12. As such, as a consequence of the testing heat which is generated inside the test chamber 12 may be transferred through the housing 20 to the outside.

Figure 5:
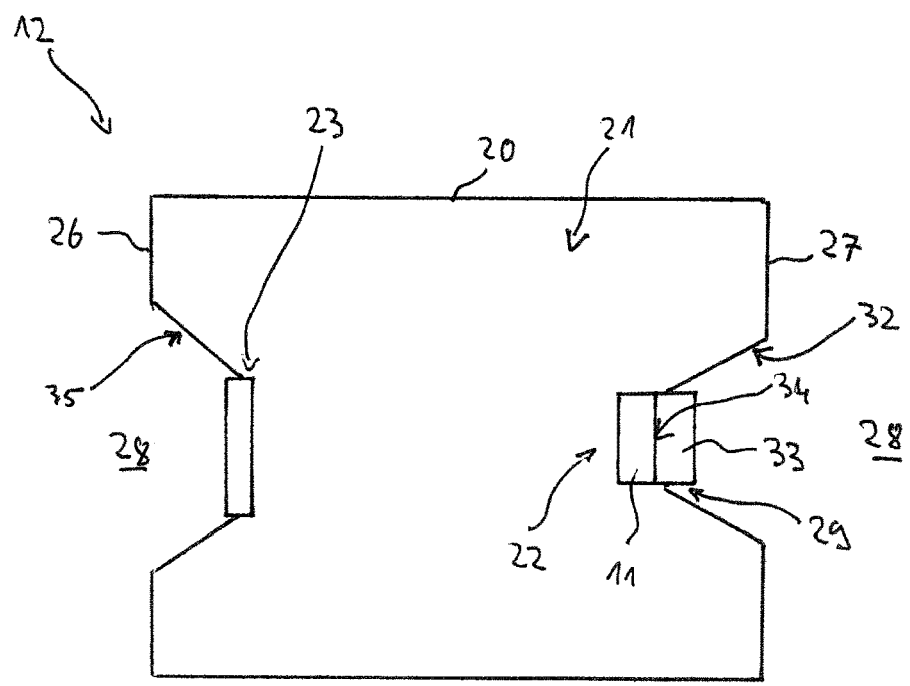
FIG. 5 shows a fourth example of the test chamber of the test system of FIG. 1.

FIG. 5 shows a fourth example of the test chamber of the test system of FIG. 1.

In contrast to the example of shown in FIG. 4, the antenna arrangement 23 is arranged partially in the interior 21 of the test chamber 12 such that portions of the antenna arrangement 22 are protruding through the housing wall 26 of the test chamber 12 to the outside 28 of the test chamber 12 in a similar way as the DUT receiving area 22 in FIG. 4. Further, similar to the DUT receiving area 22 in FIG. 4, the portions of the housing wall 26 which are surrounding the antenna arrangement 22 are tilted to form a further slope or ramp 35 around the antenna arrangement 22. This ramp 32 is also configured and shaped such to reduce reflections on the housing walls.

The antenna arrangement 23 may also comprise a heat sink (not shown in FIG. 5). Analog to the heat sink 33 of the receiving area 22, this heat sink of the antenna arrangement 23 may be embedded in the wall 26 of the test chamber 12 and protrude to the outside 28 of the test chamber 12 for heat dissipation purposes.

Figure 6:
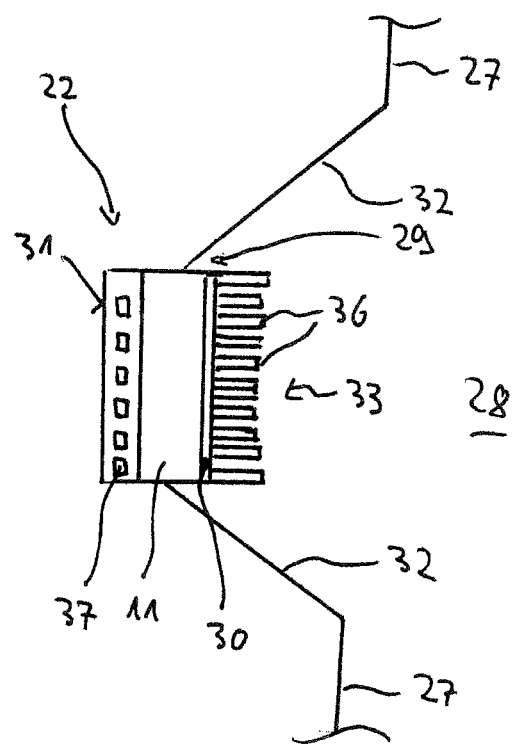
FIG. 6 shows a detail of the DUT receiving area of a test chamber according to any of the FIG. 4 or 5.

FIG. 6 shows a detail of the DUT receiving area of a test chamber according to any of the FIG. 4 or 5.

Here, the heat sink 33 comprises at least one and preferably a plurality of heat tubes 36. The heat tubes 36 are arranged completely outside 26 the test chamber 12. The heat tubes 36 are thermally coupled with the rear side 30 of the DUT 11. The front side 31 of the DUT 11, which comprises the MIMO antennas 37 or antenna arrays of the DUT 11 are fully arranged in the interior of the test chamber such that they may be tested.

Heat which is being generated during the testing of the DUT 11 can therefore effectively transferred from the AUT 37 to the rear side 30 of the DUT 11 and—due to the thermal coupling—to the heat tubes 36 of the heat sink 33.

Testing the DUTs 11 and their AUTS 37 is typically done in the very last step of a production line. Here, it is essential to test if mounting the antenna array 37 on the DUT 11 or base station adversely affects the performance of this base station, respectively. Typically, a sample-based device test is carried out in signaling mode to simulate the DUT's operation in the real world. To isolate the DUT 11 from interference, the device is placed in the diagnostic anechoic test chamber 12 which is large enough to accommodate various form factors such as a base station, smartphone, router, tablet or laptop. The tests are preferably automated using a suitable sequencer software tool. This makes it possible to detect and eliminate problems early on an essential feature for production environments.

Although the present invention has been described in the above by way of preferred embodiments, it is not limited thereto, but rather can be modified in a wide range of ways. In particular, the invention can be changed or modified in various ways without deviating from the core of the invention.

LIST OF USED REFERENCE SYMBOLS 10 test system
11 device under test, DUT
12 (anechoic/closed/shielded) test chamber
13 test equipment
14 input/output terminal, I/O terminal
15 signal generation device
16 test data stream
17 analysis device
18 response data stream
20 housing
21 (housing) interior
22 (DUT) receiving area
23 antenna arrangement
25 bracket
26 (housing) wall
27 (housing) wall
28 outside
29 opening
30 rear portion, rear side
31 front side
32 slope, ramp 33 heat sink
34 receiving surface
35 slope, ramp
36 heat tube
37 antenna under test, AUT, MIMO antenna

The invention claimed is:

1. A test chamber for testing a device under test (DUT), the test chamber comprising:
- a plurality of chamber walls defining an interior of the test chamber which are arranged and configured such to provide a closed, anechoic and shielded test chamber;
- an antenna arrangement which is arranged in the form of a plane-wave synthesizing array and which is configured to emit plane-waves into the interior of the test chamber; and
- a DUT receiving area for receiving the DUT, wherein in a test mode the DUT receiving area forms a region of measurement of the DUT, wherein the receiving area is formed by a portion of a first wall of the test chamber and wherein the DUT receiving area is configured such that during test mode heat from the DUT is transferred to the outside of the test chamber,
- wherein the receiving area comprises a first heat sink which comprises a contact surface for a mechanical contact with the DUT during the test mode, the first heat is embedded in the first wall of the DUT receiving area and protrudes to the outside of the test chamber.

2. The test chamber of claim 1, wherein the first heat sink is a heat tube.

3. The test chamber of claim 1, wherein the DUT receiving area comprises an opening for receiving the DUT, wherein the DUT receiving area and its opening are arranged and configured such that during the test mode the DUT is fully embedded in the opening and a rear portion of the DUT is protruding to the outside of the test chamber.

4. The test chamber of claim 1, wherein the portions of the first wall which are surrounding the DUT receiving area are tilted to form a slope around the DUT receiving area.

5. The test chamber of claim 1, wherein the antenna arrangement is a measurement antenna array which comprises a plurality of antenna elements.

6. The test chamber of claim 1, wherein the antenna arrangement is a plane wave converter.

7. The test chamber of claim 1, wherein the antenna arrangement is arranged fully in the interior of the test chamber.

8. The test chamber of claim 1, wherein the antenna arrangement is arranged partially in the interior of the test chamber such that other portions of the antenna arrangement are protruding through a second wall of the test chamber to the outside of the test chamber.

9. The test chamber of claim 8, wherein portions of the second wall which are surrounding the antenna arrangement are tilted to form a further slope around the antenna arrangement.

10. The test chamber of claim 1, wherein the antenna arrangement comprises a second heat sink which is embedded in a second wall of the test chamber and which is protruding to the outside of the test chamber.

11. The test chamber of claim 10, wherein the second heat sink is a heat tube.

12. A test system for testing a device under test (DUT), the test system comprising:
- a test chamber comprising:
  - a plurality of chamber walls defining an interior of the test chamber which are configured to provide an anechoic and shielded test chamber;
  - an antenna arrangement which is arranged in the form of a plane-wave synthesizing array and which is configured to emit plane-waves into the interior of the test chamber;
  - a receiving area for receiving the DUT, wherein in a test mode the receiving area forms a region of measurement of the DUT, wherein the receiving area is formed by a portion of a first wall of the test chamber and wherein the receiving area is configured such that during test mode heat from the DUT is transferred to the outside of the test chamber;
  - an input/output terminal for connecting the test chamber to a test equipment; and
- a test equipment connected to the input/output terminal and configured to transmit via the antenna arrangement a test data stream to a DUT and which is further configured to receive and to analyse corresponding response data streams,
  - wherein the receiving area comprises a first heat sink which comprises a contact surface for a mechanical contact with the DUT during the test mode, the first heat sink is embedded in the first wall of the DUT receiving area and protrudes to the outside of the test chamber.

13. The test system of claim 12, wherein the test equipment comprises a signal generation device for generating test data streams and wherein the test equipment further comprises an analysis device for analysing the received response data streams.

14. The test system of claim 12, wherein the DUT receiving area of the test chamber is configured to receive a base station and wherein the test system is configured to conduct over the air (OTA) testing of the base station.

15. A test chamber for testing a device under test (DUT), the test chamber comprising:
- a plurality of chamber walls defining an interior of the test chamber which are arranged and configured such to provide a closed, anechoic and shielded test chamber;
- an antenna arrangement which is arranged in the form of a plane-wave synthesizing array and which is configured to emit plane-waves into the interior of the test chamber; and
- a DUT receiving area for receiving the DUT, wherein in a test mode the DUT receiving area forms a region of measurement of the DUT, wherein the receiving area is formed by a portion of a first wall of the test chamber and wherein the DUT receiving area is configured such that during test mode heat from the DUT is transferred to the outside of the test chamber,
- wherein the DUT receiving area comprises an opening for receiving the DUT, wherein the DUT receiving area and its opening are arranged and configured such that during the test mode the DUT is fully embedded in the opening and a rear portion of the DUT is protruding to the outside of the test chamber.

16. A test chamber for testing a device under test (DUT), the test chamber comprising:
- a plurality of chamber walls defining an interior of the test chamber which are arranged and configured such to provide a closed, anechoic and shielded test chamber;
- an antenna arrangement which is arranged in the form of a plane-wave synthesizing array and which is configured to emit plane-waves into the interior of the test chamber; and
- a DUT receiving area for receiving the DUT, wherein in a test mode the DUT receiving area forms a region of measurement of the DUT, wherein the receiving area is formed by a portion of a first wall of the test chamber and wherein the DUT receiving area is configured such that during test mode heat from the DUT is transferred to the outside of the test chamber,
wherein the antenna arrangement is a plane wave converter.

17. A test chamber for testing a device under test (DUT), the test chamber comprising:
a plurality of chamber walls defining an interior of the test chamber which are arranged and configured such to provide a closed, anechoic and shielded test chamber;
an antenna arrangement which is arranged in the form of a plane-wave synthesizing array and which is configured to emit plane-waves into the interior of the test chamber; and
a DUT receiving area for receiving the DUT, wherein in a test mode the DUT receiving area forms a region of measurement of the DUT, wherein the receiving area is formed by a portion of a first wall of the test chamber and wherein the DUT receiving area is configured such that during test mode heat from the DUT is transferred to the outside of the test chamber,
wherein the antenna arrangement is arranged partially in the interior of the test chamber such that other portions of the antenna arrangement are protruding through a second wall of the test chamber to the outside of the test chamber.

18. A test chamber for testing a device under test (DUT), the test chamber comprising:
a plurality of chamber walls defining an interior of the test chamber which are arranged and configured such to provide a closed, anechoic and shielded test chamber;
an antenna arrangement which is arranged in the form of a plane-wave synthesizing array and which is configured to emit plane-waves into the interior of the test chamber; and
a DUT receiving area for receiving the DUT, wherein in a test mode the DUT receiving area forms a region of measurement of the DUT, wherein the receiving area is formed by a portion of a first wall of the test chamber and wherein the DUT receiving area is configured such that during test mode heat from the DUT is transferred to the outside of the test chamber,
wherein the antenna arrangement comprises a second heat sink which is embedded in a second wall of the test chamber and which is protruding to the outside of the test chamber.

\* \* \* \* \*

UNITED STATES PATENT AND TRADEMARK OFFICE
CERTIFICATE OF CORRECTION

PATENT NO. : 10,641,808 B2
APPLICATION NO. : 15/988856
DATED : May 5, 2020
INVENTOR(S) : Corbett Rowell et al.

Page 1 of 1

It is certified that error appears in the above-identified patent and that said Letters Patent is hereby corrected as shown below:

In the Claims

Column 7, Line 26, please add the word --sink-- after the word "heat" in Claim 1.

Signed and Sealed this
Eleventh Day of August, 2020

Andrei Iancu
*Director of the United States Patent and Trademark Office*